(12) United States Patent
Miyoshi et al.

(10) Patent No.: US 7,709,394 B2
(45) Date of Patent: May 4, 2010

(54) SUBSTRATE PROCESSING METHOD AND APPARATUS FABRICATION PROCESS OF A SEMICONDUCTOR DEVICE

(75) Inventors: Hidenori Miyoshi, Nirasaki (JP); Kenji Ishikawa, Kawasaki (JP); Yukio Takigawa, Kawasaki (JP); Yoshihiro Nakata, Kawasaki (JP); Hideki Tateishi, Tokyo (JP)

(73) Assignees: Tokyo Electron Limited, Tokyo (JP); Fujitsu Limited, Kawasaki-shi (JP); Ebara Corporation, Tokyo (JP)

( * ) Notice: Subject to any disclaimer, the term of this patent is extended or adjusted under 35 U.S.C. 154(b) by 231 days.

(21) Appl. No.: 11/687,738

(22) Filed: Mar. 19, 2007

(65) Prior Publication Data

US 2007/0224725 A1 Sep. 27, 2007

(30) Foreign Application Priority Data

Mar. 27, 2006 (JP) ............... 2006-086569
Feb. 26, 2007 (JP) ............... 2007-045748

(51) Int. Cl.
H01L 21/302 (2006.01)
(52) U.S. Cl. ............... 438/706; 438/618; 257/E21.245; 257/E21.31
(58) Field of Classification Search ............... 438/618, 438/689, 692, 706; 257/E21.245, E21.31
See application file for complete search history.

(56) References Cited

U.S. PATENT DOCUMENTS 4,948,629 A * 8/1990 Hacker et al. ............... 427/596
6,440,856 B1 * 8/2002 Bessho et al. ............... 438/691
6,559,543 B1 * 5/2003 Dunham et al. ............... 257/758
2002/0098685 A1 7/2002 Sophie et al.
2004/0168638 A1 9/2004 Ishii et al.
2006/0138399 A1 * 6/2006 Itano et al. ............... 257/40
2007/0179072 A1 * 8/2007 Rao et al. ............... 510/175

FOREIGN PATENT DOCUMENTS

| CN | 1605116 A | 4/2005 |
|---|---|---|
| JP | 2002-270609 | 9/2002 |
| JP | 3373499 | 11/2002 |
| WO | WO 02/091447 A1 | 11/2002 |
| WO | WO 2005/106936 A1 | 11/2005 |

OTHER PUBLICATIONS

Alessandra Satta, et al. "The Removal of Copper Oxides by Ethyl Alcohol Monitored in Situ by Spectroscopic Ellipsometry", Journal of the Electrochemical Society, vol. 150, No. 5, 2003, pp. G300-G306.

Jing Chao, et al. "Ideal Gas Thermodynamic Properties of Methanoic and Ethanoic Acids", Journal of Physical and Chemical Reference Data, vol. 7, No. 1, 1978, pp. 363-377.

* cited by examiner

Primary Examiner—Chandra Chaudhari
Assistant Examiner—Julia Slutsker
(74) Attorney, Agent, or Firm—Oblon, Spivak, McClelland, Maier & Neustadt, L.L.P.

(57) ABSTRACT

A method for processing a substrate having an insulation film and a metal layer thereon comprises the steps of supplying a carboxylic acid anhydride to the substrate, and heating the substrate during the step of supplying the carboxylic acid anhydride to the substrate.

8 Claims, 14 Drawing Sheets

FIG.1

| | Related Art. | | Carboxylic Acid Anhydrides | | Esters | | | |
|---|---|---|---|---|---|---|---|---|
| | Acetic Acid | Formic Acid | Acetic Anhydride | Propionic Anhydride | Methyl Acetate | Ethyl Acetate | Methyl Formate | Ethyl Formate |
| Melting Point (K) | 289.6 | 281.5 | 200 | 230 | 175 | 190 | 173 | 193 |
| Boiling Point (K) | 391.0 | 373.9 | 412 | 444 | 330 | 350.2 | 305 | 327 |

FIG.2

| Temperature (K) | Dimer Ratio at 1atm | Dimer Ratio at 0.1atm |
|---|---|---|
| 300 | 0.944 | 0.835 |
| 400 | 0.276 | 0.048 |
| 500 | 0.012 | 0.001 |

FIG.3

| Temperature (K) | Dimer Ratio at 1atm | Dimer Ratio at 0.1atm |
|---|---|---|
| 300 | 0.970 | 0.908 |
| 400 | 0.502 | 0.147 |
| 500 | 0.045 | 0.005 |

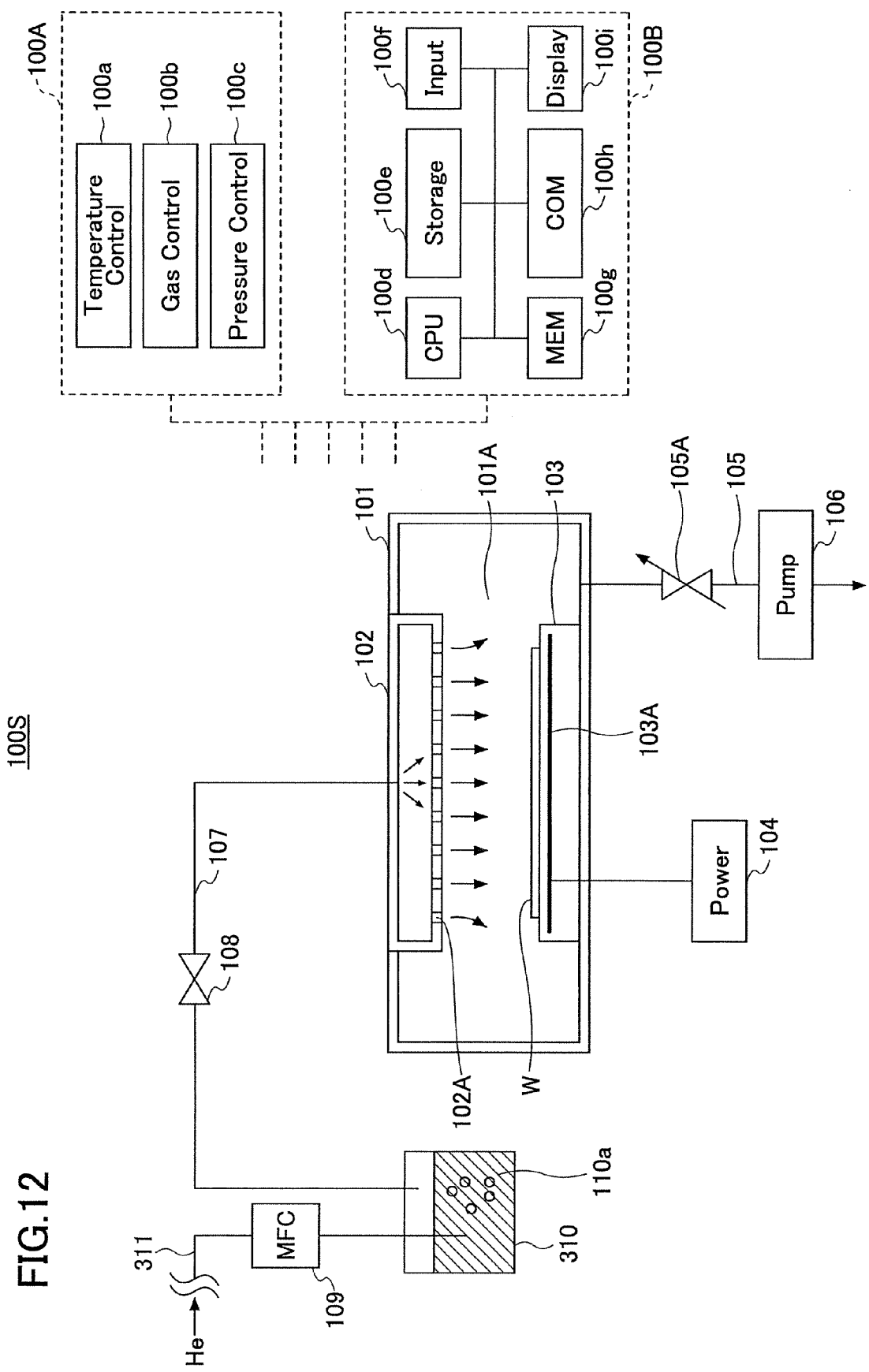

SUBSTRATE PROCESSING METHOD AND APPARATUS FABRICATION PROCESS OF A SEMICONDUCTOR DEVICE

BACKGROUND OF THE INVENTION

The present invention generally relates to substrate processing technology and more particularly to a processing method of a substrate that carries thereon a metal layer. Further, the present invention relates to a fabrication process of a semiconductor device having metal interconnection, and a substrate processing apparatus that carries out the processing of a substrate having a metal layer.

With progress in the semiconductor technology, recent high-performance semiconductor devices generally use low-resistance Cu for interconnection. Thereby, there is a concern that the exposed Cu pattern undergoes oxidation, because Cu is a material that easily gets oxidation.

Reference 1 Japanese Patent 3,373,499
Reference 2 J. Phys. Chem. Ref. Data 7, p. 363 (1993)
Reference 3 J. Electrochem. Soc. 150, p. G300, (2003)

SUMMARY OF THE INVENTION

Thus, in the related art of the present invention, there is a proposal of removing Cu oxide thus formed of such a Cu interconnection pattern by way of causing a reducing reaction by using a reducing gas such as $NH_3$ or $H_2$.

In the case $NH_3$ or $H_2$ is used for this purpose, however, there is a need of using a high process temperature for achieving the reducing reaction of Cu, and there is a concern that damages may be caused in the interlayer insulation film of so-called low-K material existing around the Cu interconnection pattern.

In view of this, there has been a proposal in another related art of the present invention of carrying out the reducing reaction of Cu at low temperature by using a processing gas formed by evaporation of formic acid or acetic acid.

However, with the use of such a vapor of formic acid or acetic acid, there appears a state in which monomers and dimmers constituting the vapor coexist, and because of this, there arises a problem that the reducing reaction becomes unstable. For example, there are cases in which the proportion of the monomers and dimers formed from the formic acid or acetic acid changes significantly when there is caused a small change of process condition, leading to instability for the reducing reaction of Cu.

Accordingly, it is an object of the present invention to provide a novel and useful substrate processing method, a fabrication process of a semiconductor device and further a substrate processing apparatus, wherein the foregoing problems are eliminated.

Thus, the present invention provides a substrate processing method and a substrate processing apparatus capable of removing an oxide film from a metal layer on a substrate stably and efficiently.

Further, the present invention provides a method of fabricating a semiconductor device wherein the oxide film formed on a metal interconnection pattern during the fabrication process of the semiconductor device is removed stably and efficiently.

In a first aspect, the present invention provides a method for processing a substrate, said substrate carrying thereon an insulation film and a metal layer, comprising the steps of:
supplying a carboxylic acid anhydride to said substrate; and
heating said substrate during said step of supplying said carboxylic acid anhydride to said substrate.

In a second aspect, the present invention provides a method for fabricating a semiconductor device having a metal interconnection pattern and an interlayer insulation film, comprising the processing steps of:
supplying a carboxylic acid anhydride to a substrate having said metal interconnection pattern and said interlayer insulation film; and
heating said substrate during said step of supplying said carboxylic acid anhydride to said substrate.

In another aspect, the present invention provides a substrate processing apparatus processing a substrate carrying thereon an insulation film and a metal layer, comprising:
a stage holding and heating said substrate;
a processing vessel accommodating said stage therein;
a gas supply part supplying a processing gas into said processing vessel; and
a gas evacuation part evacuating a gas from said processing vessel,
wherein said processing gas contains a carboxylic acid anhydride.

According to the present invention, it is possible to provide a substrate processing method and a substrate processing apparatus capable of removing an oxide film formed on a metal layer on a substrate to be processed stably and efficiently.

Further, according to the present invention, it becomes possible to provide a method of fabricating a semiconductor device in which the oxide film formed on a metal interconnection pattern during the fabrication process of the semiconductor device is removed stably and efficiently.

Other objects and further features of the present invention will become apparent from the following detailed description when read in conjunction with the attached drawings.

BRIEF DESCRIPTION OF THE DRAWINGS

FIG. 1 is a diagram comparing a melting point and a boiling point of materials;

FIG. 2 is a diagram showing a dimer proportion in a formic acid;

FIG. 3 is a diagram showing a dimer proportion of an acetic acid;

FIG. 12 is a diagram showing a substrate processing apparatus according to a fifth embodiment of the present invention;

DETAILED DESCRIPTION OF THE PREFERRED EMBODIMENTS

Figure 4:
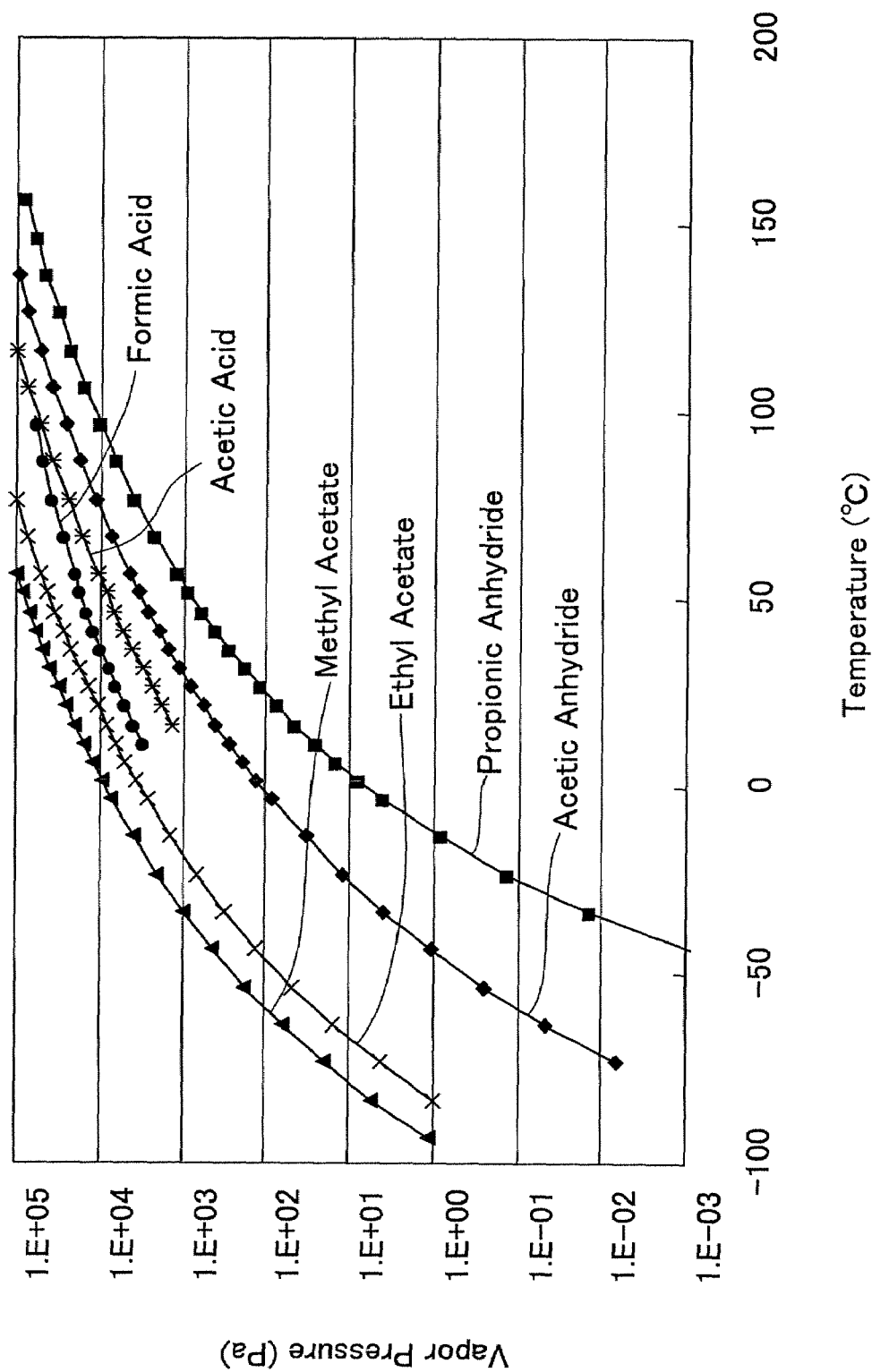
FIG. 4 is a diagram showing a vapor pressure of a carboxylic acid anhydride.

Hereinafter, the present invention will be explained for embodiments.

[Principle]

The present invention provides a method for processing a substrate, said substrate carrying thereon an insulation film and a metal layer, said method comprising the steps of supplying a carboxylic acid anhydride to said substrate, and heating said substrate while supplying said carboxylic acid anhydride to said substrate.

According to the substrate processing method of the present invention, in which carboxylic acid anhydride is used in place of formic acid or acetic acid for removing the oxide film from a metal layer (such as Cu layer), it becomes possible to carry out the removal process stably and with reproducibility.

Hereinafter, the detailed reason of using carboxylic acid anhydride for the processing gas will be explained.

FIG. 1 compares the melting point and boiling point for various substances that are potentially capable of reducing a metal oxide film.

Referring to FIG. 1, it can be seen that the acetic acid and formic acid used in the related art are characterized by high melting point. Because of this, acetic acid or formic acid shows the tendency of causing solidification as compared with carboxylic acid anhydrides or esters, and it is difficult to supply these substances to the substrate processing apparatus (processing vessel) stably in the vaporized state.

Further, with formic acid and acetic acid, there is a problem that monomers and dimers are formed at the same time in the vaporized state thereof. Reference should be made to J. Phys. Chem. Ref. Data 7, p. 363 (1993) (Reference 2).

FIG. 2 shows the proportion (compositional ratio) of dimers in a formic acid noted in the foregoing Reference 2, while FIG. 3 shows the compositional ratio of the dimers in an acetic acid noted also in the foregoing Reference 2. In FIGS. 2 and 3, it should be noted that the compositional ratio of the dimers is normalized with regard to the total of the monomers and dimers.

Referring to FIGS. 2 and 3, it can be seen that there is caused a significant change in the monomer/dimer compositional ratio in formic acid or acetic acid with change of temperature or pressure.

In the case of the formic acid of FIG. 2, for example, it can be seen that the formic acid of one atmospheric pressure contains the dimers with the compositional ratio of 90% or more at the temperature of 300 K. When the temperature is increased to 500 K in this state, on the other hand, it can be seen that the compositional ratio of the monomers increases to about 90%.

Further, it can be seen that there is caused a decrease in the compositional ratio of the dimers even when the temperature is maintained at 300 K when the pressure of the formic acid is decreased from 1 atmospheric pressure to 0.1 atmospheric pressure.

Further, at the temperature of 400 K, change in the compositional ratio of the dimers is larger than at the temperature of 300 K, when the pressure is changed from 1 atmospheric pressure to 0.1 atmospheric pressure.

Such change of compositional ratio for the monomers and dimers can be seen also in the case of acetic acid shown in FIG. 3.

When the compositional ratio of the monomers and dimers is changed with such small change of temperature or pressure in the substance used for reducing a metal oxide, the processing for removing metal oxide such as CuOx from the surface of a metal such as Cu by a reducing reaction caused by the substance becomes inevitably unstable.

Thus, the inventor of the present invention has investigated the reason why the compositional ratio of the monomers and dimers changes so significantly with formic acid or acetic acid with such a small change of the process condition.

As a result of the investigation, it was discovered that the dimers are formed as a result of hydrogen bonding of monomers via the —COOH groups, which are contained in the monomers of the formic acid or acetic acid.

In the case there exist plural monomers, for example, a dimer is formed when an oxygen atom in the —C═O bond of one monomer causes bonding with a hydrogen atom in the HO—C— bond of another monomer.

In order to overcome this problem, the inventor of the present invention has made an intensive investigation and discovered that it is possible to eliminate the problem of unstable substrate processing by using carboxylic acid anhydride in place of formic acid or acetic acid.

In addition, as noted in FIG. 1, carboxylic acid anhydride has another advantageous feature of low melting point, which is lower by 80° C. to 100° C. as compared with formic acid or acetic acid. Thus, it is possible to supply carboxylic acid anhydride stably to a reaction vessel in the state of gas (vapor).

FIG. 4 shows the vapor pressure curve of carboxylic acid anhydride, formic acid, acetic acid and other compound (ester).

Referring to FIG. 4, the carboxylic acid anhydride according to the present invention shows a vapor pressure by no means inferior to any of conventional formic acid or acetic acid, indicating that it is possible to perform the substrate processing (reduction of metal) stably and efficiently by using the carboxylic acid anhydride of the present invention.

Further, as shown in FIG. 4, it is possible to use ester for the processing gas used for the substrate processing (reduction of metal) in place of formic acid or acetic acid.

First Embodiment

Figure 5:
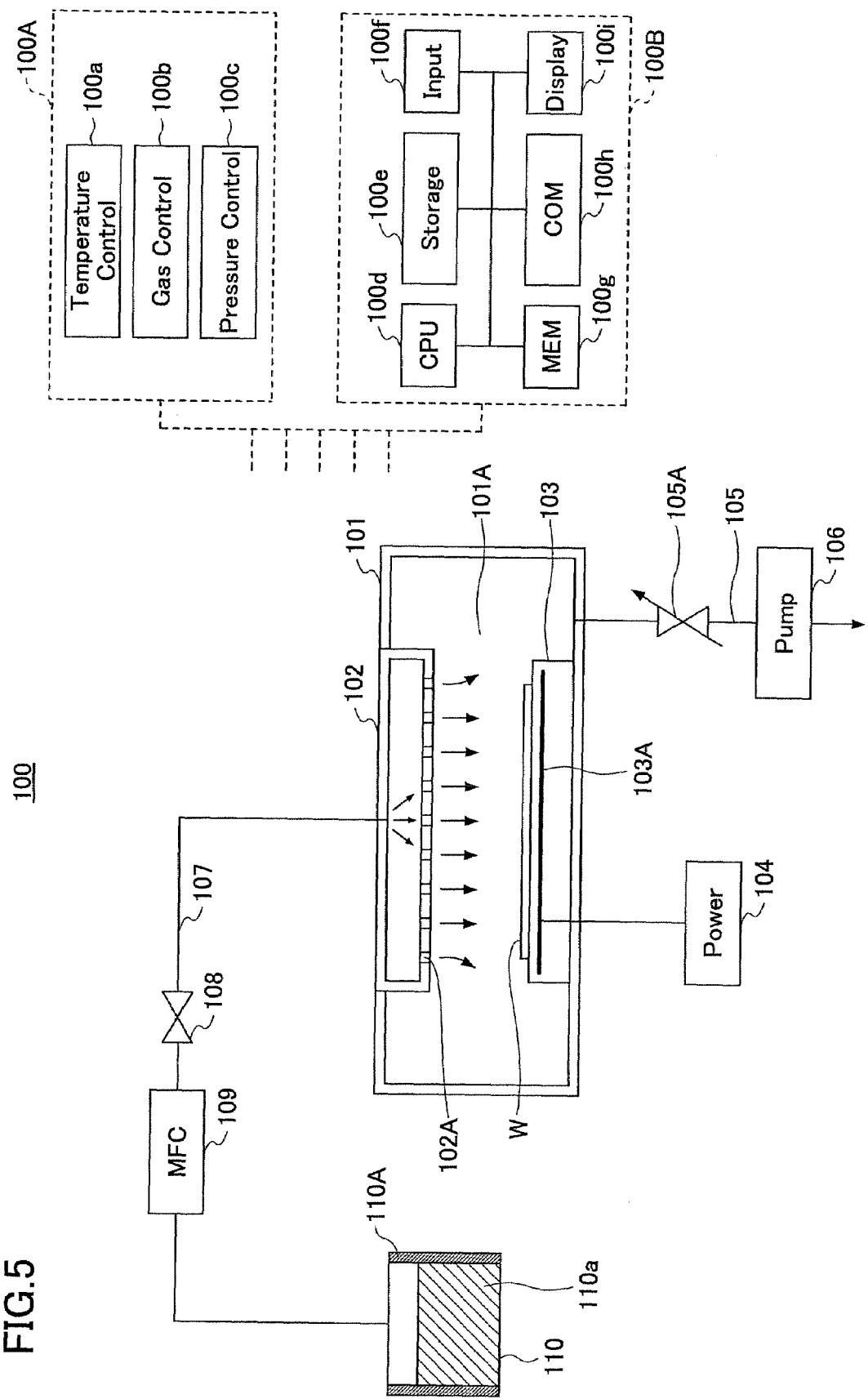
FIG. 5 is a diagram showing a substrate processing apparatus according to a first embodiment of the present invention.

FIG. 5 shows a substrate processing apparatus according to a first embodiment of the present invention.

Referring to FIG. 5, a substrate processing apparatus 100 of the present embodiment has a processing vessel 101 defining therein a processing space 101A, wherein a stage 103 holding a substrate W to be processed is accommodated into the processing space 101A.

The stage 103 is embedded with a heater 103A heating the substrate W, wherein the heater 103A is connected to a power source 104 and heats the wafer W on the stage 103 to a desired temperature.

The processing vessel 101A is evacuated through an evacuation line 105 connected to the processing vessel 101 to a vacuum state and can be maintained at a depressurized state. The evacuation line 105 is connected to an evacuation pump 106 via a pressure regulation valve 105A, and with this, the processing space 101A is set to a depressurized state of desired pressure.

Further, on the side of the processing vessel 101 facing the stage 103, there is provided a gas supplying part 102 of a showerhead structure, for example, for supplying a processing gas to the processing space 101A inside the processing vessel 101. The gas supplying part 102 is connected with a gas supplying line 107 for supplying a processing gas of carboxylic acid anhydride or ester.

The gas supplying line 107 is provided with a valve 108 and a mass-flow controller (MFC) 109 and is connected to a source supply unit 110 that holds a source 110a of carboxylic acid anhydride or ester.

The source supply unit 110 is provided with a heater 110A, wherein the source 110a is evaporated when heated by the heater 110A. The vapor of the source 110a thus formed is then supplied to the gas supplying part 102 via the gas supplying line 107.

Because carboxylic acid anhydride or ester takes a liquid form at room temperature, and because the temperature of solidification is lower with carboxylic acid anhydride or ester than that of acetic acid or formic acid, the carboxylic acid anhydride or ester can be supplied to the processing space 101A as the processing gas with improved process stability as compared with the case of using acetic acid or formic acid for the processing gas.

Further, it is preferable to construct the gas supplying line 107 such that the gas supply line 107 can be heated to a temperature higher than the vaporization temperature of the source material. With such a construction, it is possible to prevent condensation of the gas inside the gas supplying line 107.

The processing gas supplied to the gas supplying part 102 is supplied to the processing space 101A through a plurality of gas holes 102A formed in the gas supplying part 102, and the processing gas thus supplied to the processing space 101A reaches the substrate W, which is held at a predetermined temperature by the heater 103A. Thereby, desired removal of oxide film is achieved from a Cu interconnection pattern formed on the substrate W by way of reducing of Cu.

Further, in the case of vaporizing the source 110a or supplying the vaporized source (processing gas) 110a to the processing space 101A, it is possible to construct such that the processing gas is supplied to the processing space 101A together with a carrier gas such as an Ar gas, $N_2$ gas or a He gas.

With regard to the carrier gas, it is also possible to use other chemically inert gas such as a Ne gas, a Kr gas, a Xe gas, or the like. Further, it is possible to recycle such a rare gas used for the carrier gas from the exhausted gas, by using a rare gas separator unit.

Further, it is possible to add, to the processing gas of carboxylic acid anhydride or ester, a gas not influencing the material of the substrate or other reducing gas chemically. For such other reducing gas, $H_2$, $NH_3$, and the like, may be used.

The operation of the substrate processing apparatus 100 for conducting the substrate processing is controlled by a control unit 110A, while the control unit 100A, in turn, is controlled by a program stored in a computer 100B. In FIG. 5, it should be noted that illustration of various interconnections between the computer 100B, the control unit 100A and various parts of the substrate processing apparatus 100 is omitted.

It should be noted that the control unit 100A includes a temperature control unit 100a, a gas control unit 100b and a pressure control unit 100c, wherein the temperature control unit 100a controls the temperature of the stage 103 by way of controlling a power supply 104, while such control of the temperature of the stage 103 provides control of the temperature of the substrate W, which is heated by the stage 103.

The gas control unit 100b, on the other hand, supervises opening and closing of the valve 108 and flow rate control of the MFC 109 and further controls the state of the processing gas supplied to the processing space 101A.

Further, the pressure control unit 100c controls the evacuation pump 106 and the degree of valve opening of the pressure regulation valve 105A and controls the pressure inside the processing space 101A to a predetermined pressure.

As noted, the control unit 100A is under control of the computer 100B, and thus, the substrate processing apparatus 100 is actually operated by the computer 100B. As usual, the computer 100B includes a CPU 100d, a recording medium 100e, an input unit 100f, a memory 100g, a communication unit 100h and a display unit 100i.

In one example, the program of the substrate processing is recorded in the recording medium 100e and the substrate processing is carried out according to such a program. Further, the program may be loaded by way of the communication unit 100h or by way of the input unit 100f.

Next, an experiment of such a substrate processing conducted by the substrate processing apparatus 100 will be explained in detail below.

In this experiment, acetic anhydride vapor was used for the processing gas.

In preparation of the substrate processing, a liquid of acetic anhydride formed with a purity of 90% or more was loaded into the source supply unit 110 as the source 110a in the state that the source 110a is not exposed to the air.

Further, in anticipation of the possibility that gases in the air may be dissolved into the acetic anhydride liquid according to the Henry's law, a vacuum degassing process was conducted such that the acetic anhydride vapor of substantially 100% is obtained and supplied.

Further, by using the heater 110A around the source supply unit 110, the source 110a was heated to a temperature of 303-323 K (30-50° C.), such that sufficient vapor pressure is obtained for the source material. With this experiment, the temperature of the source 110a was set to 318 K (45° C.).

The substrate processing to be described below was conducted according to the program explained before.

First, a substrate W carrying a metal layer to be processed at least on a part thereof was placed upon the stage 103, and the temperature control unit 100b controls the heater 103A such that the substrate W is heated to the temperature of 303-323 K (30-50° C.).

Next, the processing gas was supplied over the substrate W from the gas supplying part 102 uniformly by opening the valve 108, wherein opening of the valve 108 was conducted after two minutes from the timing of placing the substrate W on the stage 103, by taking into consideration of the duration needed for temperature elevation of the substrate W, during which the heat is transferred from the stage 103 to the substrate W.

In the present example, the MFC 109 was controlled by the gas control unit 100b and the vapor of acetic anhydride was supplied to the processing vessel 101 by way of the gas control unit 100b with the flow rate of 10-1000 sccm.

Further, with the pressure control unit 100c, the pressure regulation valve 105A was controlled and the pressure of the processing space 101A was controlled to 10-1000 Pa.

In the present example, the flow rate of the acetic anhydride was set to 100 sccm and the pressure of the processing space 101A was set to 400 Pa.

Thus, the substrate processing was applied to the substrate W held on the stage 103 for the duration of one minute under the condition of controlled processing pressure and controlled gas supply rate.

Thereafter, the valve 108 was closed and the processing gas remaining in the processing space was evacuated by the evacuation pump 106. With this, the processing was completed and the substrate W was taken out from the processing vessel 101.

Next, with regard to the substrate W thus processed, the amount of reduction of the metal layer (Cu layer), and hence the amount of removal of the oxide film from the Cu layer, was evaluated.

Hereinafter, the method of measuring the thickness of the oxide film on the metal layer and the result of evaluation conducted by the foregoing measuring method will be explained briefly.

Figure 6:
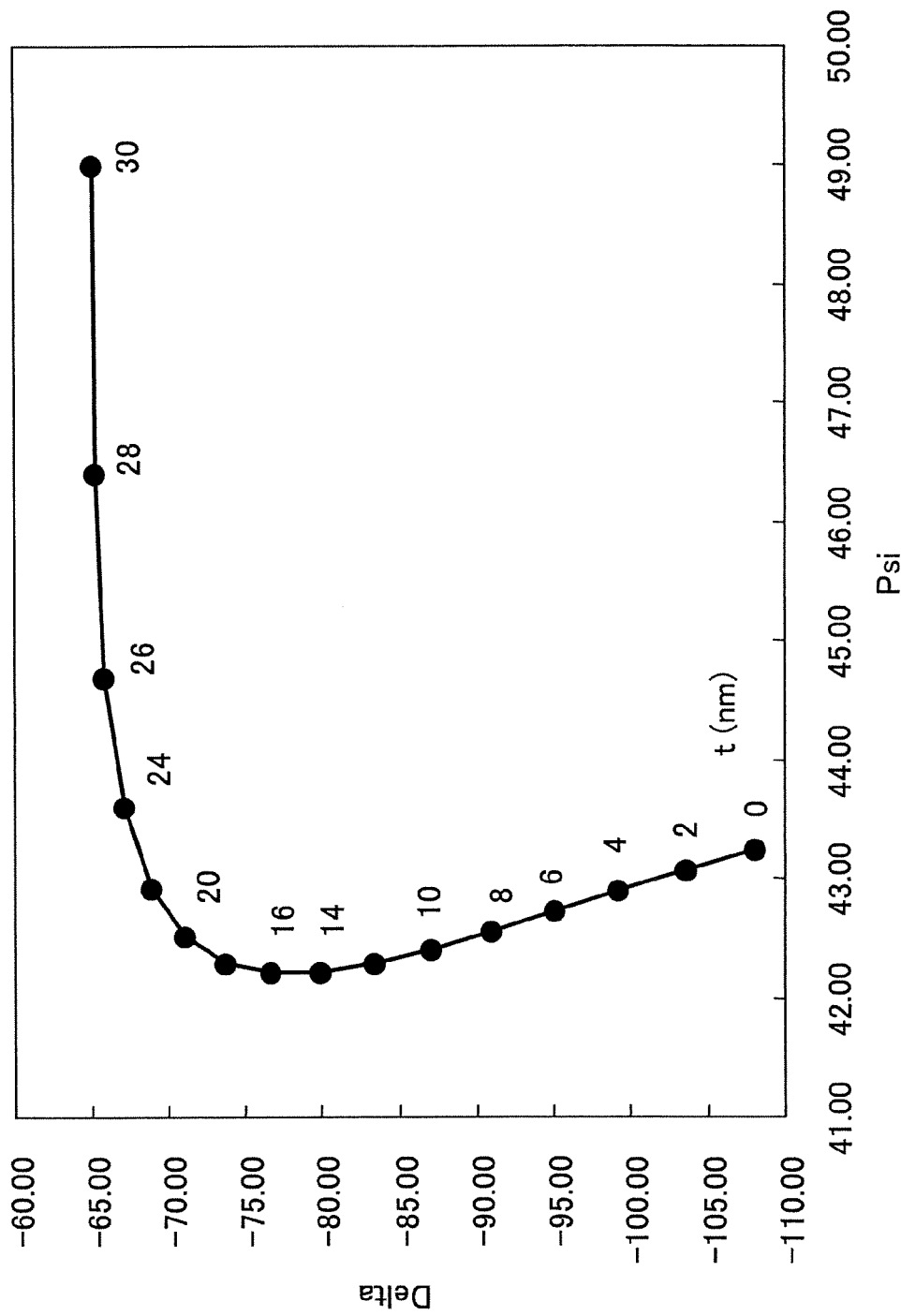
FIG. 6 is a diagram showing a measuring method of film thickness by ellipsometry.

FIG. 6 shows the relationship between the parameters $\psi$ (Psi) and $\Delta$ (Delta) obtained by visible light ellipsometry that uses a visible light for the measurement of film thickness of the oxide film (copper oxide film) formed on a Cu layer, wherein it should be noted that the relationship of FIG. 6 shows the results for the case of changing the thickness t of the copper oxide film from 0 nm to 30 nm.

Referring to FIG. 6, it can be seen that the polarization angle of the visible light ellipsometry changes depending on the thickness of the oxide film. In FIG. 6, it should be noted that the values of $\psi$ and $\Delta$ are calculated by setting the optical constants of Cu and copper oxide respectively to 0.23577+3.42087i and 2.63595+0.224295i. With regard to the optical constants used herein, reference should be made to J. Electrochem. Soc. 150, p. G300, 2003 (Reference 3).

Thus, before the substrate processing, a thin film of Cu was formed on a part of the substrate W and examination was made on the surface state of the Cu film thus formed by using the visible light ellipsometry, in which polarization state $\rho$ of the visible light reflected from the Cu film is represented in terms of the polarization parameters $\psi$ and $\Delta$ according to the relationship of $$\rho = \tan \psi \exp(i\Delta).$$

As a result of the measurement, it was confirmed that the parameters $\psi$ and $\Delta$ take the values of −100.23 and 43.82, respectively for the Cu film in the state before the substrate processing. From the relationship shown in FIG. 6, this result indicates that there is formed a copper oxide on the surface of the Cu film on the substrate W with a thickness of 3-4 nm in the state before the processing.

In the case of thickness measurement of such a thin oxide film, the change of the film thickness appears predominantly in the value of the parameter $\Delta$. Thus, with the present embodiment, the state of the surface processing of the substrate W, and hence the thickness of the copper oxide, is evaluated by using the parameter $\Delta$.

As explained with the previous embodiment, the substrate W is then subjected to a processing conducted by the acetic anhydride under the pressure of 400 Pa at the temperature of 523 K (250° C.).

More specifically, after carrying out the foregoing substrate processing for one minute, the Cu surface on the substrate W is measured again by using the visible light ellipsometry technology.

In this measurement, it was confirmed that the parameters $\Delta$ and $\psi$ take the values of −106.63 and 43.79, while these values indicate that the thickness of the copper oxide film is reduced to 1-2 nm.

From the results noted above, it was confirmed that the copper oxide film can be removed with the substrate processing that uses acetic anhydride even when the processing is conducted at a low substrate temperature of 250° C. or less.

Next, in another experiment, the substrate processing was conducted similarly by using acetic anhydride as noted above but under the pressure of 100 Pa at the substrate temperature of 250° C. or higher, and the thickness of the cupper oxide was measured by the visual ellipsometry similarly to the case noted before.

As a result of the foregoing measurement, it was confirmed that the decrease rate of the copper oxide film thickness can be increased by using the substrate temperature higher than 250° C.

From this experiment, it can be seen that the treatment with the acetic anhydride of the present invention is effective not only at low temperatures but also at high temperatures. Thus, as long as no damages are caused in the insulation film, the substrate processing of the present invention can be conducted at high temperatures of 250° C. or more.

In order to confirm the effect of decrease of the residual copper oxide film thickness, the ellipsometry was conducted for the substrate in which the foregoing processing was conducted for 10 minutes.

As a result of the measurement, it was confirmed that the parameter $\Delta$ has the value of −110, while this indicates that there is no copper oxide film on the Cu film.

While the foregoing experiments were conducted by using acetic anhydride for removal of the Cu oxide film (reduction of Cu), the present invention is not limited to such a case of using acetic anhydride but other carboxylic acid anhydrides having similar reactivity may also be used.

The carboxylic acid anhydride that can be used for the processing gas may be represented generally as R1-CO—O—CO—R2, wherein R1 and R2 are any of a hydrogen atom, a hydrocarbon group, or a functional group in which at least a part of hydrogen atoms constituting a hydrocarbon group are substituted with a halogen atom.

Thereby, the hydrocarbon group may be any of alkyl group, alkenyl group, alkynyl group, aryl group, or the like. For the halogen atom, it is possible to use any of fluorine, chlorine, bromine and iodine.

Further, for the carboxylic acid anhydride, it is possible to use acetic anhydride, formic anhydride, propionic anhydride, acetic formic anhydride, butyric anhydride, valeric anhydride, and the like. Because formic anhydride and acetic formic anhydride are relatively unstable substance, it is more preferable to use a carboxylic acid anhydride other than formic anhydride or acetic formic anhydride.

Further, similar processing can be achieved also by using an ester having a nature near carboxylic acid anhydride for the processing gas in place of the carboxylic acid anhydride. Such an ester can be represented generally as R3-COO—R4, wherein R3 is any of a hydrogen atom, a hydrocarbon group or a functional group in which at least a part of hydrogen atoms constituting a hydrocarbon group are substituted with a halogen atom, and R4 is any of a hydrocarbon group or a functional group in which at least a part of hydrogen atoms constituting a hydrocarbon group are substituted with a halogen atom.

More specifically, such a hydrocarbon group may be any of alkyl group, alkenyl group, alkynyl group, aryl group, and the like. For the halogen atom, it is possible to use any of fluorine, chlorine, bromine and iodine.

Further, for the foregoing ester, it is possible to use any of methyl formate, ethyl formate, propyl formate, butyl formate, benzyl formate, methyl acetate, ethyl acetate, propyl acetate, butyl acetate, pentyl acetate, hexyl acetate, octyl acetate, acetic acid phenyl, benzyl acetate, acetic acid allyl, propenyl acetate, methyl propionate, ethyl propionate, butyl propionate, pentyl propionate, benzyl propionate, methyl butyrate, ethyl butyrate, pentyl butyrate, butyl butyrate, methyl valerate, ethyl valerate, and the like.

With regard to the reducing reaction caused by the foregoing carboxylic acid anhydrides or esters, the reducing reaction may be caused by the following mechanism.

One possibility is that the C=O bond in the carboxylic acid anhydrides or esters contribute to the foregoing reducing reaction. Further, in view of the fact that the processing capability is improved when water ($H_2O$) is added, there is a possibility that water chemically adsorbed in the oxide film on the metal layer or the water physically adsorbed on the surface of the oxide film contributes to the reducing reaction. Further, there is a possibility that water is adsorbed also on the metal layer.

Further, it should be noted that the foregoing substrate processing (reducing reaction) can be applied to the removal of the oxide film formed on a metal interconnection pattern, particularly a Cu interconnection pattern, in the fabrication process of a semiconductor device.

In such a semiconductor device, it is usual that an interlayer insulation film embedded with a metal interconnection pattern is formed on a substrate to be processed. Thus, in the reducing reaction caused by the carboxylic acid anhydrides or esters noted above, there is a high possibility that water ($H_2O$) adsorbed to the interlayer insulation film contributes to the reaction. In such a case, it is possible to carry out dehydration of the interlayer insulation film together with removal of the oxide film from the metal interconnection pattern by conducting the substrate processing of the present invention. In this case, water that contributes to the reducing reaction of the metal interconnection pattern is obtained from the interlayer insulation film.

Figure 7:
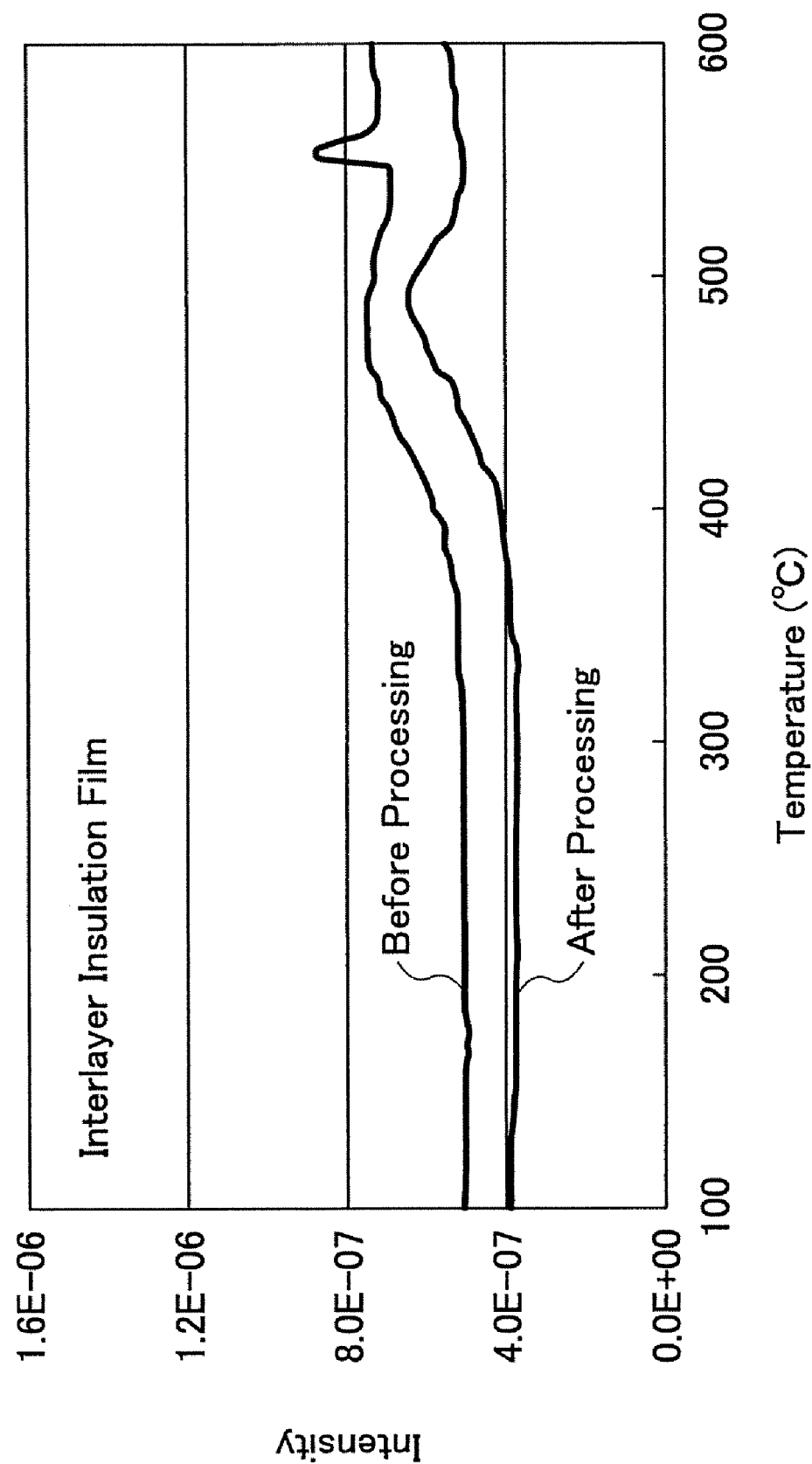
FIG. 7 is a diagram comparing the results of thermal desorption spectroscopy (TDS) measuring the amount of degassing from a substrate on which an insulation film and a metal layer are formed, before and after the acetic anhydride processing of the present invention.

FIG. 7 is a diagram comparing the results of thermal desorption spectroscopy (TDS) conducted for the degassing from the substrate under processing that carries thereon an insulation film, before and after the substrate processing conducted by the acetic anhydride according to the present invention. In FIG. 7, the horizontal axis represents the temperature of the substrate to be processed while the vertical axis represents the intensity of the degassing, wherein it should be noted that this intensity is proportional to the amount of degassing.

Referring to FIG. 7, it can be seen that the amount of degassing after the substrate processing by the acetic anhydride is decreased as compared with the substrate before the processing over the entire temperature region.

In FIG. 7, it should be noted that the comparison is made for the amount of degassing at the same condition except only that the substrate processing with the acetic anhydride is conducted in one group and no such a substrate processing is conducted in another group. Thus, the foregoing difference of spectra is attributed to the existence and non-existence of the substrate processing by the acetic anhydride.

Thus, it is believed that the result of FIG. 7 reflects the situation that the amount of degassing caused as a result of heating is reduced as a result of escaping of the substance contained in the interlayer insulation film, which in turn is caused as a result of the substrate processing conducted using the acetic anhydride. This substance includes water as noted before.

Further, because there occurs escaping of water vapor in the temperature range of 100-600° C. included in FIG. 7, it is thought that the escaping of gas caused with heating as shown in FIG. 7 includes escaping of water or water vapor. Thus, from the foregoing, it is believed that there is caused accelerated dehydration of the interlayer insulation film as a result of the substrate processing conducted by using the acetic anhydride. With such dehydration of the interlayer insulation film, it is possible to obtain the effect such as improvement of withstand voltage for the interlayer insulation film.

Figure 8:
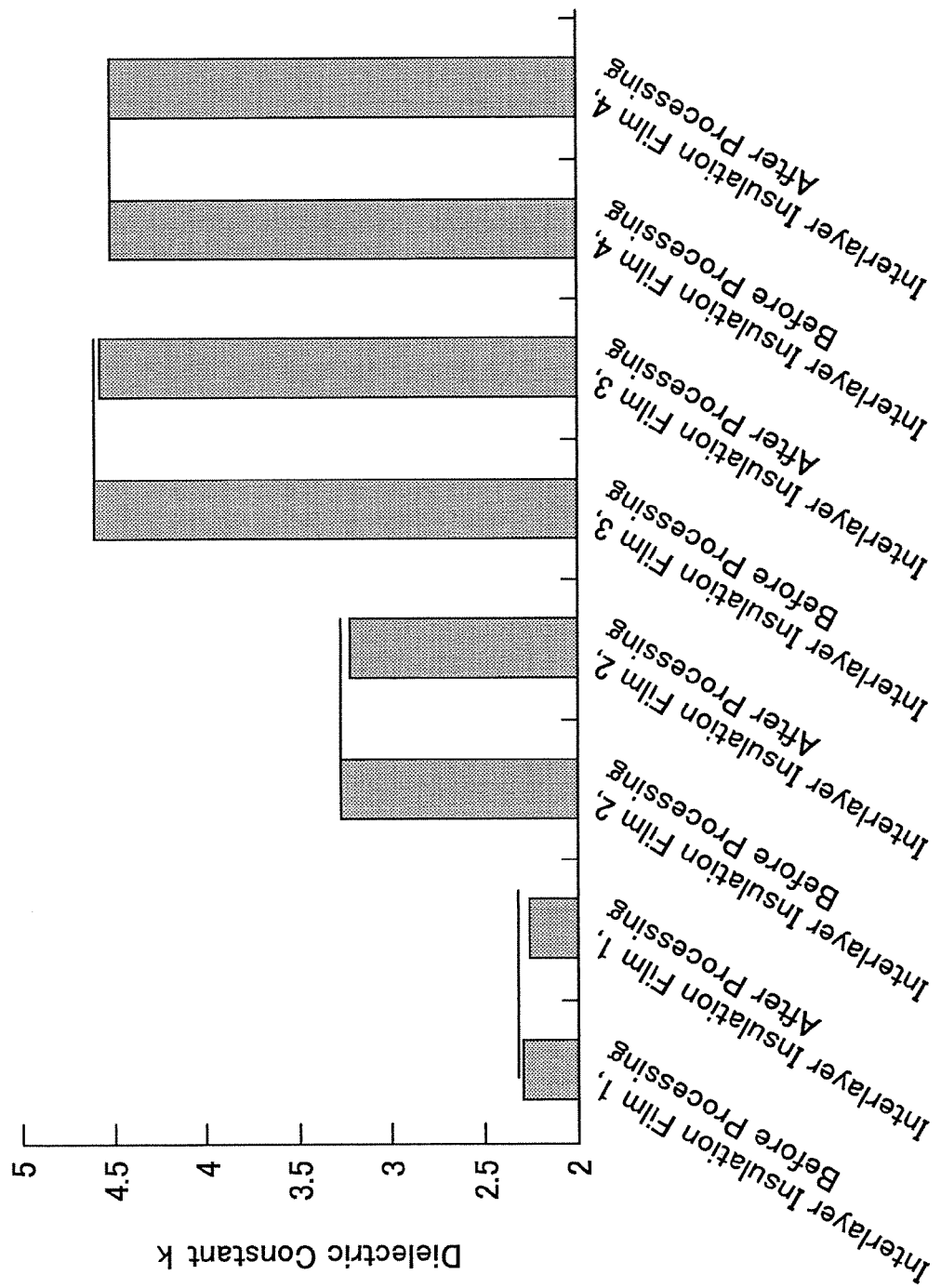
FIG. 8 is a diagram comparing a dielectric constant of various interlayer insulation films before and after the acetic anhydride processing of the present invention.

FIG. 8 is a diagram comparing the dielectric constant of various interlayer insulation films before and after the substrate processing by the acetic anhydride of the present invention. In FIG. 8, it should be noted that the interlayer insulation films 1 and 2 are formed of a low-K material, while the interlayer insulation films 3 and 4 are formed of a diffusion barrier layer used for example as a cap layer of Cu multilayer interconnection structure.

Referring to FIG. 8, it can be seen that there is caused little change of dielectric constant in the interlayer insulation films 1 and 2 before and after the substrate processing. Further, it should be noted that these interlayer insulation films maintain the low dielectric constant lower than that of $SiO_2$ even after such a substrate processing with the acetic anhydride.

Further, it is also confirmed that there occurs no change of dielectric constant with regard to the insulation films 3 and 4. Further, it can be seen that the insulation films 3 and 4 maintain a low dielectric constant lower than that of SiNx, which has been used conventionally for the diffusion barrier layer.

Thus, it was demonstrated that the substrate processing of the present invention that uses acetic anhydride is a processing that does not cause change in the dielectric constant of the insulation film. The fact that the dielectric constant of an insulation film is not changed means that the substrate processing of the present invention that uses acetic anhydride is a processing that does not cause damages in the insulation film under processing.

It should be noted that such improvement of electric properties of the insulation film as a result of dehydration is enhanced particularly in the case the interlayer insulation film is a low-K (low dielectric constant) material characterized by large water absorbability. Such a film of low-K material used for the low-K interlayer insulation film includes porous films and the films that contain fluorine such as CxFy film or SiOF film.

Further, it was confirmed that, in the case acetic anhydride is used for the processing gas, there is caused no meaningful change of mass with regard to the materials used for the apparatus including quartz, alumina, aluminum nitride, anodized aluminum (JIS A5052 and A5052 processed with OGF (registered trademark) processing), stainless steel (JIS SUS304 and SUS316), nickel, Hastelloy (trademark), and the like, even when they are exposed to the ambient of acetic anhydride at 300° C. for 100 Pa.

Further, as a result of total reflection X-ray fluorescence measurement conducted for a silicon wafer exposed to the acetic anhydride ambient, it was confirmed that the metal contamination caused by the foregoing material of the apparatus is below the detection limit of the total reflection X-ray fluorescence. From this result, it is concluded that there is caused no significant corrosion in the material of the apparatus by the acetic anhydride.

Second Embodiment

In order to improve the efficiency of the reducing reaction, it is also possible to supply $H_2O$ into the processing vessel actively.

Hereinafter, a second embodiment of the present invention will be described for the construction in which an $H_2O$ supplying unit is added to the substrate processing apparatus 100 for supplying water vapor into the processing vessel 101.

Figure 9:
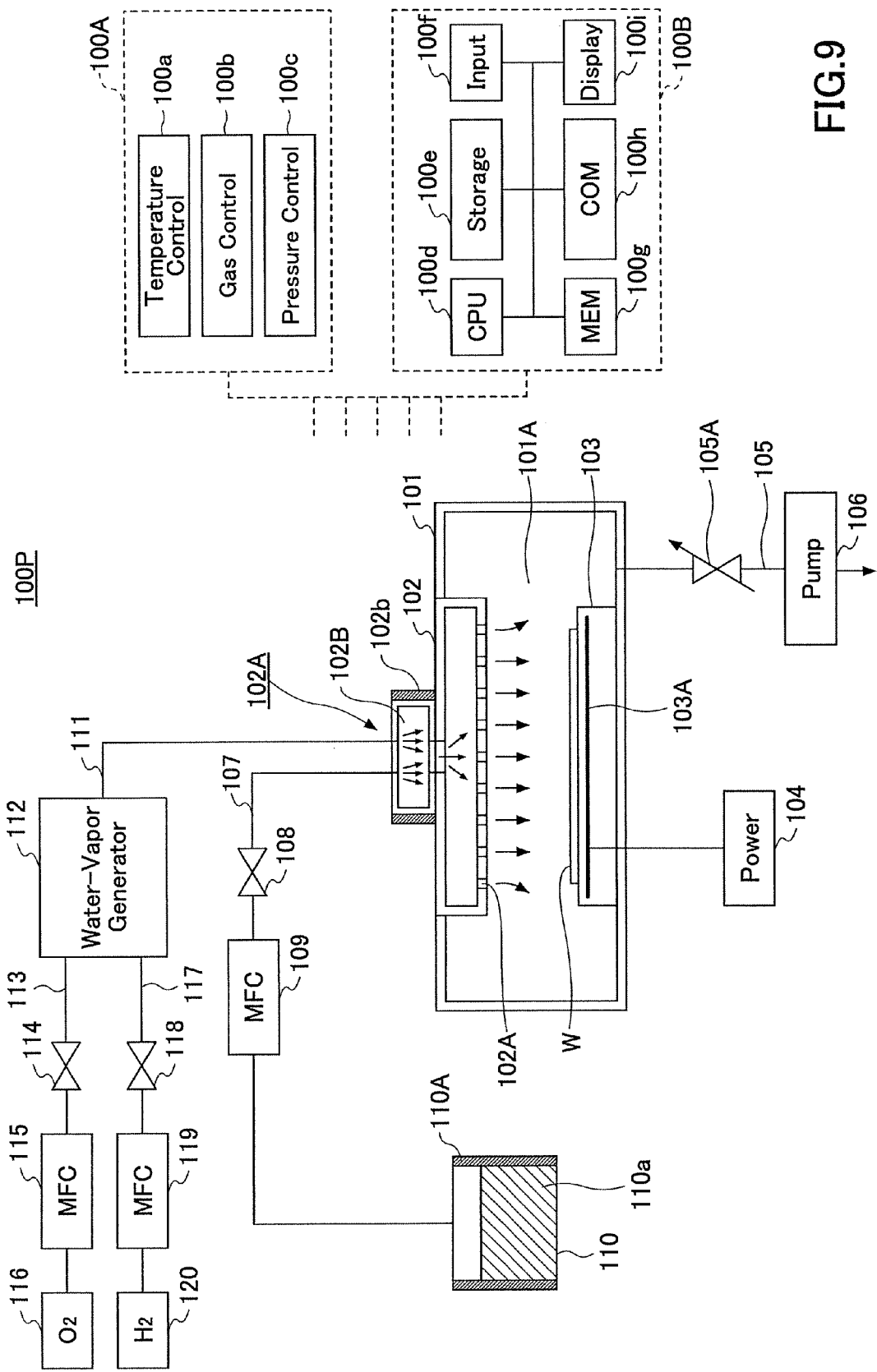
FIG. 9 is a diagram showing a substrate processing apparatus according to a second embodiment of the present invention.

FIG. 9 is a diagram showing the construction of a substrate processing apparatus 100P according to the second embodiment of the present invention, wherein those parts corresponding to the parts described previously are designated by the same reference numerals and the description thereof will be omitted.

Referring to FIG. 9, the substrate processing apparatus 100P of the present embodiment has a construction similar to that of the substrate processing apparatus 100 of FIG. 5, except that there is further provided a $H_2O$ supplying unit for supplying water vapor ($H_2O$) to the processing vessel 101 in addition to the vapor of carboxylic acid anhydride or ester.

Thus, with the substrate processing apparatus 100P of the present embodiment, there is provided a gas mixing part 102A connected to the gas supplying part 102, wherein the gas mixing part 102A is supplied with water vapor ($H_2O$) from a water-vapor generator ($H_2O$ supplying unit). Further, the gas mixing part 102A is constructed to receive the water vapor from the water-vapor generator 112.

With the construction of FIG. 9, the water is supplied from a gas supplying line 111 to a reaction promoting chamber 102B defined inside the gas mixing part 102A, wherein the gas supplying line 111 is connected to the reaction promoting chamber 102B together with the gas supplying line 107. Thus, in the reaction promoting chamber 102B, both the carboxylic acid anhydride or ester and $H_2O$ are supplied and mixed with each other.

The mixed gas of the carboxylic acid anhydride or ester and $H_2O$ is supplied to the processing space 101A via the gas supplying part 102. Further, there is disposed a heater 102$b$ at the outside of the reaction promoting chamber 102B, and the mixed gas of carboxylic acid anhydride or ester and $H_2O$ is heated to a predetermined temperature, which may be higher than the substrate temperature.

Further, an oxygen gas and a hydrogen gas are supplied to the water-vapor generator 112 respectively via a gas line 113 and 117, wherein the gas line 113 is connected to an oxygen gas source 116 via a valve 114 and an MFC 115. Similarly, the gas line 117 is connected to a hydrogen gas source 117 via a valve 118 and an MFC 119.

Thereby, the gas supplying unit 100$b$ further controls with the present embodiment, the opening and closure operation of the valves 114 and 118, the control of the MFCs 115 and 117, and further the control of the water-vapor generator 112, and with this, the water vapor supplied through the gas supplying line 111 is controlled by the gas control unit 100$b$.

By conducting the substrate processing by using the substrate processing apparatus 100P of the present embodiment, it becomes possible to supply the water vapor to the processing space 101A, in addition to the carboxylic acid anhydride or ester. Thus, it becomes possible to remove the metal oxide film on the metal interconnection pattern with reduced time as compared with the case in which the water vapor is not supplied.

In order to perform the dehydration processing of the interlayer insulation film or insulation film concurrently with the present embodiment, it is desirable to control the amount of the water vapor thus supplied by taking into consideration the effect of dehydration of the insulation film.

Thus, in the case the interlayer insulation film is formed of a material of large water absorbability, the amount of the water vapor supplied to the processing space 101A is set small or even zero, while in the case the interlayer insulation film is formed of a material of small water absorbability, the amount of the water vapor supplied to the processing space 101A may be increased for increasing the efficiency of removal of the metal layer.

Third Embodiment

Figure 10:
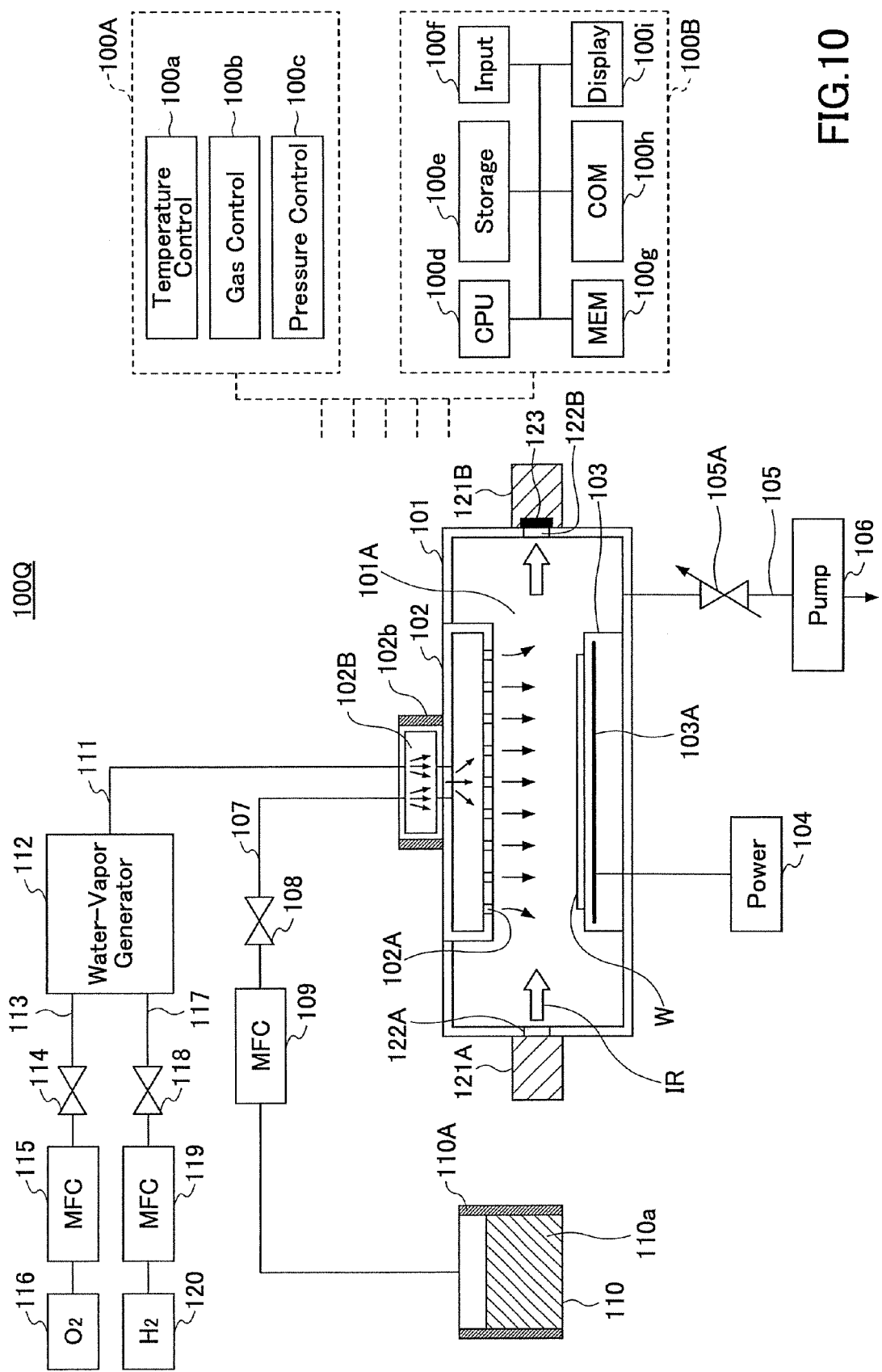
FIG. 10 is a diagram showing a substrate processing apparatus according to a third embodiment of the present invention.

FIG. 10 is a diagram showing the construction of a substrate processing apparatus 100Q according to a third embodiment of the present invention, wherein those parts corresponding to the parts described previously are designated by the same reference numerals and the description thereof will be omitted.

Referring to FIG. 10, the substrate processing apparatus 100Q of the present embodiment has a construction similar to that of the substrate processing apparatus 100P of FIG. 9, except that there is provided a $H_2O$ detection unit for detecting the amount of the water vapor supplied to the processing vessel 101.

In the illustrated example, the $H_2O$ detection unit includes an infrared source 121A and an infrared detector 122B provided on the processing vessel 101 so as to oppose each other across the processing space 101A. Further, the processing vessel 101 is provided with infrared windows 122A and 122B respectively in correspondence to the infrared source 121A and the infrared detector 121B.

Thus, with the construction of FIG. 10, there is provided an infrared lamp, or the like, as the infrared source 121A at the location corresponding to the infrared window 122A, and there are provided an interference filter 123 and an infrared detector 121B at the location corresponding to the infrared window 122B.

Measurement of water vapor by the foregoing H2O detection unit is conducted as follows.

First, an infrared beam IR is irradiated into the processing space 101A from the infrared source 121A in the vacuum evacuation state of the processing vessel 101 and the transmission intensity of the infrared beam through the processing space 101A for this state is measured by the infrared detector 121B.

Next, in the state in which the water vapor is supplied into the processing space 101A, the intensity of the infrared beam passing through the processing space 101A is measured by irradiating the infrared beam from the infrared source 121A and detecting the infrared beam by the infrared detector 121B.

With this, it becomes possible to determine the attenuation caused in the infrared beam by the water vapor introduced into the processing space 101A, and from this, it becomes possible to detect the amount of $H_2O$ in the processing vessel 101.

For the interference filter 123, it is preferable to use a filter element having a transmission band in the wavelength where there occurs decrease of transmission intensity in the infrared beam as a result of absorption by $H_2O$. Preferably, the infrared filter 123 has a transmission band from 3 μm and 6-7 μm. Further, it is possible to provide plural filter elements with different wavelength bands for the interference filter 123. With such a construction, it is possible to detect the $H_2O$ component with improved precision.

Further, it is possible to construct the infrared source 121A and infrared detector 121B in the form of a unitary body by using a multiple reflection mirror.

Further, it is possible to construct that the amount of the water vapor supplied from the water vapor generator 112 is controlled depending on the detection value of the infrared detector 121B that form the $H_2O$ detection unit together with the infrared source 121A.

In this case, the gas control unit 100b controls the water vapor generator 112 such that the detection value of water vapor is maintained constant at an optimum value. Further, the $H_2O$ detection unit may be used also for measuring the effect of dehydration of the interlayer insulation film.

Further, it is possible to control the amount of the water vapor supplied to the processing vessel 101 by taking into consideration the degree of dehydration of the interlayer insulation film. For example, it is possible to control the amount of the supplied water vapor to be small or zero when a substance of large water absorbability is used for the interlayer insulation film and increase the amount of the supplied water vapor when the interlayer insulation film is formed of a substance of small water absorbability.

Further, it is possible to provide the $H_2O$ detection unit of the present embodiment to the substrate processing apparatus 100 of the first embodiment. In this case, it becomes possible to detect the amount of $H_2O$ introduced into the processing vessel 101 in the state adsorbed on the substrate, and it becomes possible to optimize the preprocessing of the substrate processing of the present invention such as the process of changing the amount of adsorbed water based on the detected amount of $H_2O$.

Fourth Embodiment

Figure 11:
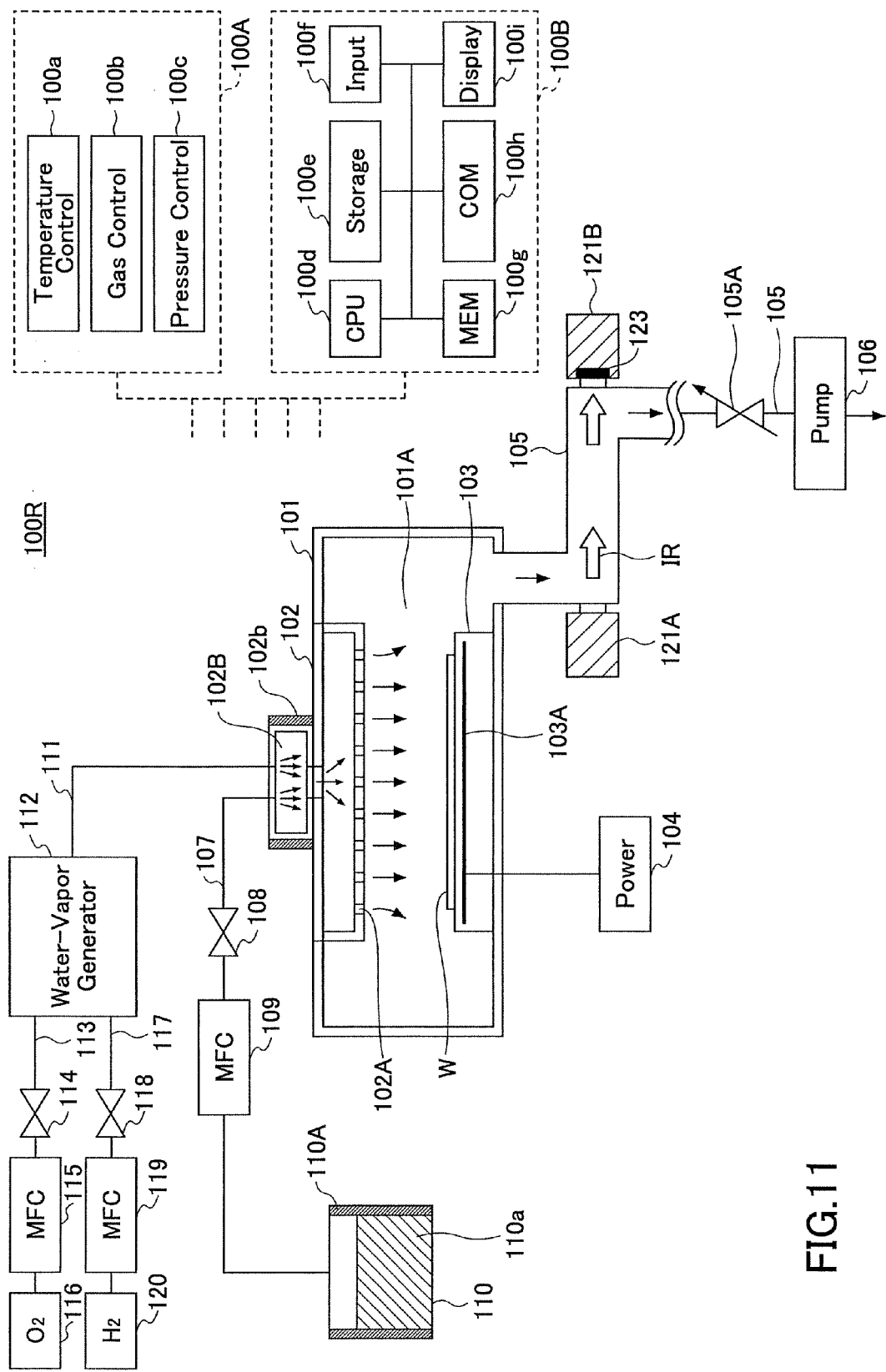
FIG. 11 is a diagram showing a substrate processing apparatus according to a fourth embodiment of the present invention.

FIG. 11 is a diagram showing the construction of a substrate processing apparatus 100R according to a fourth embodiment of the present invention, wherein those parts corresponding to the parts described previously are designated by the same reference numerals and the description thereof will be omitted.

Referring to FIG. 11, the substrate processing apparatus 100R of the present embodiment has a construction similar to that of the substrate processing apparatus 100Q of the previous embodiment except that the $H_2O$ detection unit is now provided to the evacuation line 105.

Thus, with the present embodiment, the infrared source 121A and the infrared detector 121B are provided to the evacuation line 105 so as to oppose with each other, and the evacuation line 105 is provided with infrared windows 122A and 122B respectively in correspondence to the infrared source 121A and the infrared detector 121B.

Further, similarly to the substrate processing apparatus 100Q of the previous embodiment, an infrared lamp is provided as the infrared source 121A in correspondence to the infrared window 122A, and the interference filter 123 and the infrared detector 121B are provided in correspondence to he infrared window 122B.

Further, in the case of providing the $H_2O$ detection unit to the evacuation line 105, it is preferable to provide the infrared source 121A and the infrared detector 121B as illustrated in FIG. 11 for increasing the optical path length. Thus, it is preferable that the infrared source 121A and the infrared detector 121B are disposed so as to oppose with each other with a predetermined distance in the evacuation direction of the evacuation line 105.

By disposing the infrared source 121A and the infrared detector 121B as noted above, a long optical path length is secured between the infrared source 121A and the infrared detector 121B, and it becomes possible to detect the amount of water vapor with high precision even in the case the optical absorption taking place therein is small. Further, it is possible to increase the optical path length by using a multiple reflection mirror.

It should be noted that the $H_2O$ detection unit is not limited to the construction explained heretofore, but other construction such as the one that uses an oscillator and detector of millimeter wave may be used. In this case, the oscillation wavelength may be set coincident to the absorption band of $H_2O$.

Further, it is possible to provide an $H_2O$ monitor that measures the amount of $H_2O$ by way of detecting the change of capacitance of a polymer film caused by absorption of water, on the wall or evacuation part of the processing vessel 101.

Fifth Embodiment

FIG. 12 is a diagram showing the construction of a substrate processing apparatus 100S according to a fifth embodiment of the present invention, wherein those parts corresponding to the parts described previously are designated by the same reference numerals and the description thereof will be omitted.

Referring to FIG. 12, the substrate processing apparatus 100S has a construction similar to that of the substrate processing apparatus 100 of FIG. 5 except that a source supply unit 310 is provided in place of the source supply unit 110 of the substrate processing apparatus 100.

Referring to FIG. 12, the source supply unit 310 is a bubbling unit and supplies the vapor of the source 110a therein to the processing space 101A in the processing vessel 101 via the gas supplying line 107 after causing vaporization or sublimation therein.

Thus, the source supply unit 310 is supplied with an inert gas from a gas line 311 as a carrier gas, and the vapor of the source formed as a result of vaporization or sublimation is supplied to the processing vessel 101 together with the carrier gas.

With the present embodiment, too, the substrate processing apparatus 100S can be used similarly to the substrate processing apparatus 100 of the first embodiment, with similar effect.

Further, the vaporization (supplying) of the source material 110a may be conducted by way of (direct) liquid injection.

Sixth Embodiment

Next, fabrication process of a semiconductor device according to the substrate processing method of the present invention will be described as a sixth embodiment of the present invention with reference to FIGS. 13A-13E with reference to the drawings. The process hereinafter may be conducted by using any of the substrate processing apparatuses 100, 100P, 100Q, 100R and 100S explained before.

Figure 13A:
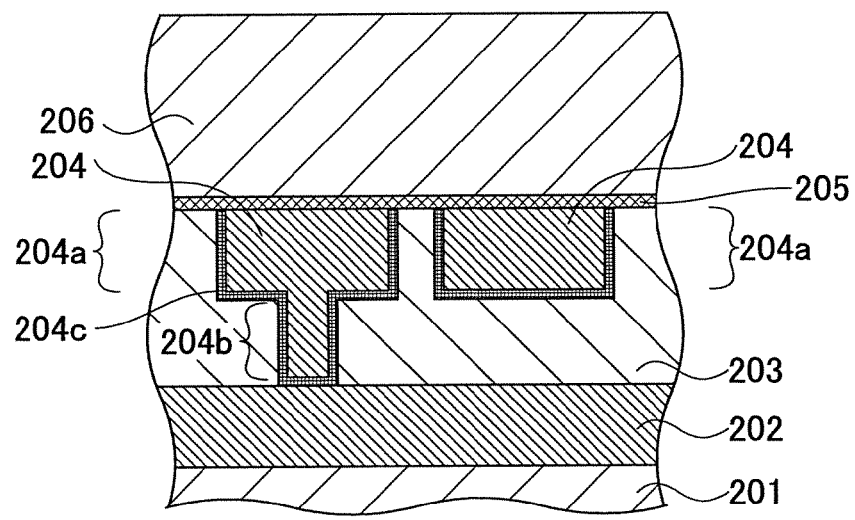
FIGS. 13A-13E are diagrams showing the fabrication process of a semiconductor device (substrate processing method) according to a sixth embodiment of the present invention.

Referring to FIG. 13A, there is formed an insulation film 201 such as a silicon oxide film on a semiconductor substrate (not shown) corresponding to the substrate W explained before, such that the silicon oxide film 201 covers an active element such as a transistor (not shown) formed on the silicon substrate. In the silicon oxide film 201, there are provided an interconnection pattern (not shown) formed by W (tungsten) for example in electrical connection with the active layer, and an interconnection layer 202 of Cu, for example, is formed on the silicon oxide film 201.

On the silicon oxide film 201, there is formed a first insulation layer (interlayer insulation film) 203 so as to cover the interconnection layer 202.

The first insulation layer 203 is formed with an interconnection trench 204a and a via-hole 204b, wherein the interconnection trench 204a and the via-hole 204b are filled with Cu and form together an interconnection pattern 204 formed of Cu trench pattern in the interconnection trench 204a and a Cu via-plug in the via-hole 204b. The interconnection pattern 204 is thus connected electrically to the interconnection layer 202 at the Cu via-plug.

Further, it can be seen in FIG. 13A that there is formed a barrier metal film 204c between the first insulation layer 203 and the interconnection pattern 204, wherein it should be noted that the barrier metal film 204c functions to block the diffusion of Cu atoms from the interconnection pattern 204 to the first insulation layer 203. Further, there is formed an insulation layer 205 functioning as a Cu diffusion barrier so as to cover the interconnection pattern 204 and the first insulation film 203, and a second insulation layer (interlayer insulation film) 206 is formed further on such a Cu diffusion barrier 205.

Hereinafter, the method of fabricating a semiconductor device by forming the interconnection pattern of Cu in the second insulation layer 206 by using the substrate processing method explained before will be described. Thereby, it should be noted that the interconnection part 204 can also be formed by the same process explained below.

Figure 13B:
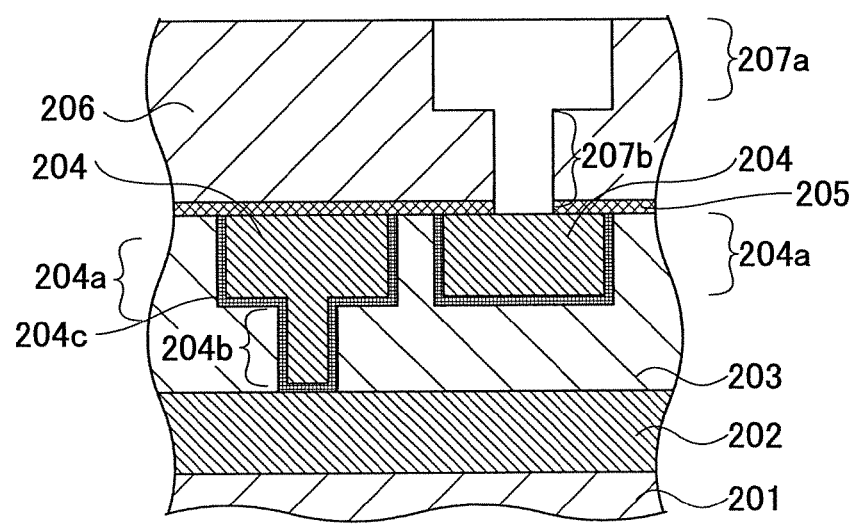

Referring to FIG. 13B, there is conducted a step of forming an interconnection trench 207a and a via-hole 207b in the second insulation layer 206 by using a dry etching process, or the like, wherein it should be noted that the via-hole 207b is formed to penetrate through the insulation layer 205. With this, a part of the Cu interconnection pattern 204 is exposed at the via-hole 207b thus formed in the second insulation layer 206, while such exposure may cause formation of oxide film (not shown) on the exposed surface of the Cu interconnection pattern 204.

Figure 13C:
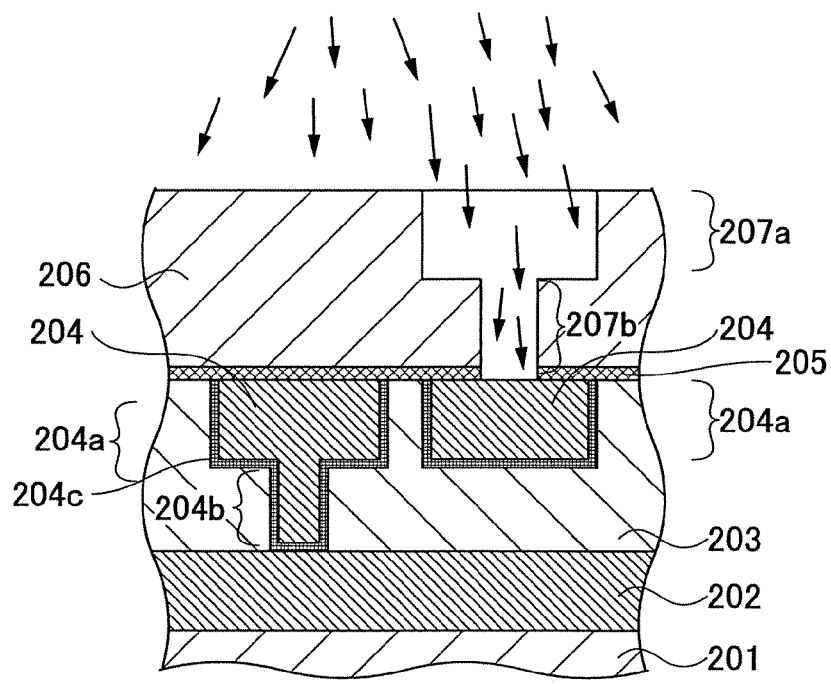

Thus, in the step of FIG. 13C, there is conducted a process of removing any Cu oxide film thus formed from the exposed Cu surface by causing a reducing reaction of Cu by applying the substrate processing explained with reference to the first embodiment while using any of the substrate processing apparatuses 100, 100P, 100Q, 100R and 100S. Thereby, removal of the Cu oxide film is achieved by supplying the vapor of carboxylic acid anhydride or ester to the substrate to be processed under heating of the substrate.

In this reducing process of the present invention, it is possible to lower the substrate temperature as compared with the case of carrying out the reducing reaction with $H_2$ or $NH_3$ as in the case of the related art. For example, it is possible with the present invention to conduct the reducing processing at a temperature of 573 K (300° C.) or less. Such low-temperature substrate processing of the present invention enables to cause reducing reaction processing at low temperature such as 573 K (300° C.) or less, while such low temperature process is particularly advantageous for the case in which the interlayer insulation film is formed of a low-K material, which easily experiences damaging when exposed to heat.

On the other hand, when the substrate temperature of the foregoing substrate processing is too low, there is a possibility that the reducing reaction does not proceed sufficiently. Thus, it is preferable with the present invention to use the substrate temperature of 373 K (100° C.) or higher for the processing of the substrate. Thus, during the substrate processing of the present invention, it is preferable to control the substrate temperature to the range of 373 K (100° C.) to 573 K (300° C.).

As explained before, it is possible with the process of the present invention, to achieve dehydration of the interlayer insulation film at the same time of removing the copper oxide from the copper interconnection pattern 204. In such a case, carboxylic acid anhydride or ester is supplied to the second insulation layer 206 and the dehydration of the layer 206 is promoted. Thereby, electric properties of the second insulation layer 206 are improved. Such improvement includes decrease of dialectic constant, improvement of withstand voltage, and the like.

While such improvement of electric properties with dehydration is achieved in the case the second insulation layer 206 is a silicon oxide film ($SiO_2$) film, the effect of improvement becomes particularly significant in the case the second insulation layer 206 is formed of a low-K material characterized by large water absorbability such as a porous film or a film containing fluorine.

Further, in order to improve the efficiency of Cu oxide removal, it is possible to supply water vapor ($H_2O$) to the substrate to be processed while using the substrate processing apparatus 100P in this process step. Thereby, it is preferable to control the amount of the supplied water vapor according to the dehydration effect of the interlayer insulation film. Such controlled supply of water vapor is achieved advantageously by using the substrate processing apparatus 100Q or 100R. By using the substrate processing apparatus 100Q or 100R, the amount of the supplied water vapor may be set small or to zero in the event a material of large water absorbability is used for the interlayer insulation film. Further, in the case a material of small water absorbability is used for the interlayer insulation film, the amount of the supplied water vapor may be increased for improved stability of the removing reaction of the copper oxide.

Figure 13D:
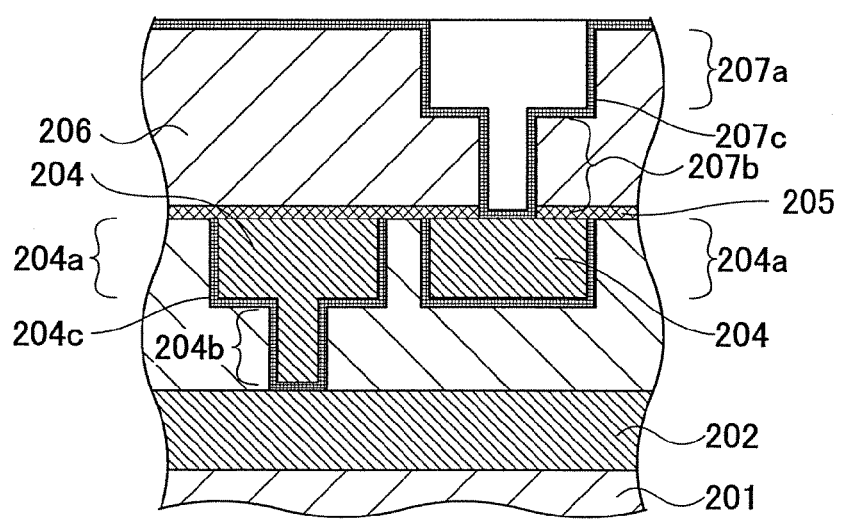

Next, in the step of FIG. 13D, formation of a barrier metal film 207c is conducted on the second insulation film 206 including the inner wall surfaces of the interconnection trench 207a and the via-hole 207b and further on the exposed surface of the Cu interconnection pattern 204. Typically, the barrier metal film 207c is formed of a refractory metal or a nitride thereof, or lamination of a refractory metal film and a nitride film. For example, the barrier film 207c is formed of a Ta/TaN film, a WN film or a TiN film and can be formed by a sputtering process or CVD process. Further, such a barrier metal film 207c can be formed by so-called ALD (atomic layer deposition) process.

Figure 13E:
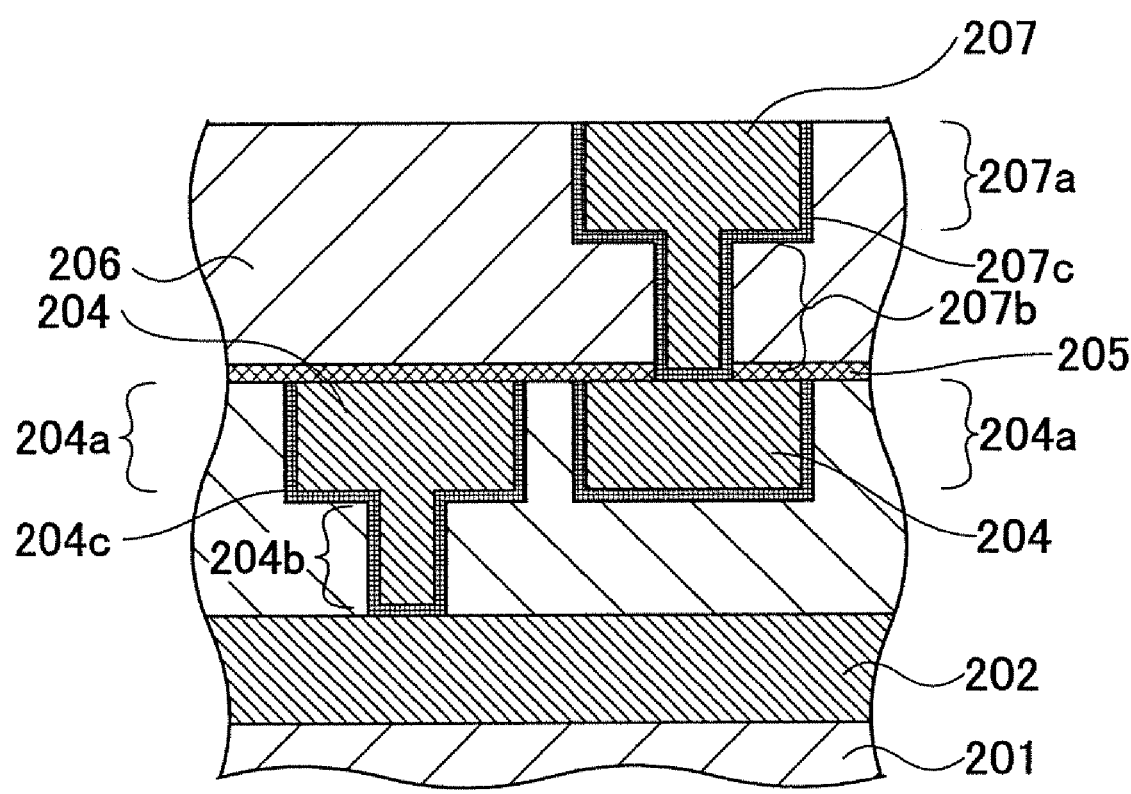

Next, in the step of FIG. 13E, a Cu interconnection pattern 207 of Cu is formed on the barrier metal film 207c so as to fill the interconnection trench 207a and the via-hole 207b. Such a Cu interconnection pattern 207 may be formed by an electrolytic plating process after forming a seed layer of Cu by a sputtering process or a CVD process. Further, it is possible to form the interconnection pattern 207 also by a CVD process or ALD process.

After formation of the interconnection pattern 207, the surface of the substrate is planarized by a chemical mechanical polishing (CMP) process.

Further, after the step of FIG. 13E, it is possible to form (2+n)th insulation films (n being an integer) and form a Cu interconnection pattern in the respective insulation layers to form a desired multilayer interconnection structure.

While the present embodiment has been explained for the case of forming the multilayer interconnection structure of Cu while using dual damascene process, the preset invention is also effective in the case of forming such a multilayer interconnection structure by a single damascene process.

Further, while explanation has been made heretofore for the case of forming a Cu interconnection pattern for the metal interconnection pattern or interconnection layer in the insulation layer, the present invention is not limited to such a Cu interconnection pattern but is applicable also to the case of forming the metal interconnection pattern of Ag, W, Co, Ru, T, Ta, or the like.

Thus, according to the fabrication process of the present embodiment, it becomes possible to carry out removal of the oxide film formed on a metal interconnection pattern stably with reliability and reproducibility. Further, with the present embodiment, it is possible to carry out dehydration of the interlayer insulation film at the same time to the removal of the oxide film from the metal interconnection pattern.

Thus, it becomes possible to carry out the removal of oxide film from the metal interconnection pattern and the dehydration process of the interlayer insulation film at the same time, and the fabrication process of semiconductor device is simplified.

Further, while explanation has been made for the case of carrying out the removal of the oxide film from the metal layer and dehydration of the interlayer insulation film at the same time, the present invention is by no means limited to such a simultaneous process and it is possible to carry out the dehydration process of the interlayer insulation film separately without substantially removing the metal oxide film from the metal layer. In such a case, it is possible to use carboxylic acid anhydride or ester described in the foregoing embodiments. Such a process can be conducted by using similar substrate processing method and similar substrate processing apparatus explained with reference to the foregoing embodiments.

While the present invention has been explained for preferred embodiments, the present invention is by no means limited to such a specific embodiment and various variations and modifications may be made without departing from the scope of the invention.

It is possible to apply the substrate processing method of the present invention not only to the process of removing the Cu oxide film from the exposed surface of the lower Cu interconnection pattern exposed as a result of etching of the insulation layer, but also to the process of removing the surface Cu oxide film in other process steps. For example, it is possible to apply the present invention after formation of the seed layer or interconnection pattern or after carrying out the CMP process.

According to the present invention, it is possible to provide a substrate processing method and a substrate processing apparatus capable of removing an oxide film formed on a metal layer on a substrate to be processed stably and efficiently.

Further, according to the present invention, it becomes possible to provide a method of fabricating a semiconductor device in which the oxide film formed on a metal interconnection pattern during the fabrication process of the semiconductor device is removed stably and efficiently.

The present invention is based on Japanese priority applications 2006-086569 filed on Mar. 27, 2006 and 2007-045748 filed on Feb. 26, 2007, the entire contents of which are hereby incorporated by reference.

What is claimed is:

1. A method for processing a substrate having an insulation film and a metal layer thereon, comprising:
    supplying a carboxylic acid anhydride in a state of a gas phase to said substrate; and
    heating said substrate during said step of supplying said carboxylic acid anhydride to said substrate,
    wherein an oxide film on said metal layer is removed during said heating step.

2. The method as claimed in claim 1, wherein said metal layer comprises a Cu layer.

3. A method for processing a substrate having an insulation film and a metal layer thereon, comprising:
    supplying a carboxylic acid anhydride in a state of a gas phase to said substrate; and
    heating said substrate during said step of supplying said carboxylic acid anhydride to said substrate,
    wherein said processing supplies $H_2O$ together with said carboxylic acid anhydride.

4. A method for processing a substrate having an insulation film and a metal layer thereon, comprising:
    supplying a carboxylic acid anhydride in a state of a gas phase to said substrate; and
    heating said substrate during said step of supplying said carboxylic acid anhydride to said substrate,
    wherein said carboxylic acid anhydride comprises at least one of acetic anhydride, propionic anhydride, butyric anhydride and valeric anhydride.

5. A method for fabricating a semiconductor device having a metal interconnection pattern and an interlayer insulation film, comprising processing by:
    supplying a carboxylic acid anhydride to a substrate having said metal interconnection pattern and said interlayer insulation film in the state of a gas phase; and
    heating said substrate during said step of supplying said carboxylic acid anhydride to said substrate,
    wherein said processing removes an oxide film on said metal interconnection pattern.

6. The method as claimed in claim 5, wherein said metal interconnection pattern comprises a Cu pattern.

7. A method for fabricating a semiconductor device having a metal interconnection pattern and an interlayer insulation film, comprising the processing by:
    supplying a carboxylic acid anhydride to a substrate having said metal interconnection pattern and said interlayer insulation film in the state of a gas phase; and
    heating said substrate during said step of supplying said carboxylic acid anhydride to said substrate,
    wherein said processing supplies $H_2O$ to said substrate together with said carboxylic acid anhydride.

8. A method for fabricating a semiconductor device having a metal interconnection pattern and an interlayer insulation film, comprising the processing by:
    supplying a carboxylic acid anhydride to a substrate having said metal interconnection pattern and said interlayer insulation film in the state of a gas phase; and
    heating said substrate during said step of supplying said carboxylic acid anhydride to said substrate,
    wherein said carboxylic acid anhydride comprises at least one of acetic anhydride, propionic anhydride, butyric anhydride and valeric anhydride.

* * * * *